United States Patent [19]

Kreuzer

[11] Patent Number: 4,913,524

[45] Date of Patent: Apr. 3, 1990

[54] SYNTHETIC IMAGING TECHNIQUE

[75] Inventor: Justin L. Kreuzer, Trumbull, Conn.

[73] Assignee: The Perkin-Elmer Corporation, Norwalk, Conn.

[21] Appl. No.: 193,015

[22] Filed: May 12, 1988

[51] Int. Cl.[4] .............................................. G02B 27/46
[52] U.S. Cl. ................................................ 350/162.12
[58] Field of Search .................................... 350/162.12

[56] References Cited

U.S. PATENT DOCUMENTS 3,563,634  2/1971  Parks et al. ...................... 350/162.12
4,360,269  11/1982  Iwamoto et al. ................ 350/162.12

OTHER PUBLICATIONS

Goodman, J. W., *Introduction to Fourier Optics*, McGraw Hill, N.Y., pp. 141-144.

*Primary Examiner*—Bruce Y. Arnold
*Attorney, Agent, or Firm*—Thomas P. Murphy; Edwin T. Grimes

[57]  ABSTRACT

An optical system wherein a mask pattern occurring at a predetermined period is imaged with a period less than the predetermined period. Spatial filter means are disposed within the optical system for permitting only the two (positive and negative) first orders of light from an illumination source diffracted by the mask pattern to pass therethrough.

9 Claims, 1 Drawing Sheet

SOURCE          MASK              STOP (FILTER)           IMAGE

SYNTHETIC IMAGING TECHNIQUE

BACKGROUND OF THE INVENTION

One type of data storage media utilize optical disks. In this type of data storage photolithographic techniques are utilized to form circular or spiral patterns on glass disks in much the same way as integrated circuits are formed on silicon wafers. The patterns consist of lines and spaces on which data may be permanently or temporarily stored. In the latter case the lines and or spaces may be formed of sensitive material on which lasers may be used to read, write or erase and rewrite. More conventional read, write and rewrite techniques such as magnetic read-write heads may also be used. A very important feature of such memory disks is the density at which data may be stored thereon. The storage density is a function of the closeness at which discrete lines and spaces are formed on the disks.

BRIEF SUMMARY OF THE INVENTION

In the present invention an illumination source projects light through a mask positioned at the object plane of an imaging optical system such as a projection mask aligner. In a typical projection mask aligner of the type disclosed in U.S. Pat. Nos. 3,748,015; 4,293,186 and 4,011,011 the pattern of the mask would be projected or imaged on the target, e.g., a wafer or optical disk without change in the image. The number of lines and spaces, on the mask pattern would be reproduced on the optical disk without a change in the period. In normal practice the newest model of the Micralign Model 600 projection mask aligners of the type manufactured by the Perkin-Elmer Corporation of Norwalk, Connecticut is capable of forming high contrast (modulation) images of repetitive patterns such as groups of lines and spaces, concentric circles or spirals with the same mask ($\lambda_m$) and image ($\lambda_i$) period as small as $$\lambda_m = \lambda_i = \Lambda/NA = 2.2 \text{ um}$$

where the Model 600 has a numerical aperture of NA=0.167. The wave length is $\Lambda$=365 nm. the image can be used to expose a light sensitive coating on a glass disk to meet the specific requirements of an optical disk. This small period approaches the practical limits of photolithography. Repetitive patterns of smaller period, 1.7 to 1.3 um, can be imaged only under ideal conditions because of the low contrast image. In addition, the depth of focus is very limited.

In the present invention the image differs significantly from the mask pattern: the image period is one half the mask period, i.e., the previous 2.2 um period is imaged as a high contrast 1.1 um period image. In addition this image has a large depth of focus. To carry out this invention means are provided within the optics of the projection system to block out all orders of light diffracted by the mask pattern except for the desired positive and negative first orders.

In a practical embodiment the invention comprises an off-axis system comprising a concave and convex mirror arranged to have their centers of curvature coincident or nearly on the optical axis. An illumination source projects light of controlled coherence through a mask disposed at one conjugate to image the pattern at the other conjugate point of the system. Obscuration means are provided at the convex mirror (system pupil) to block all orders of light diffracted by the mask pattern except the two first orders from reaching the target, e.g., the optical disk. This results in an image of the mask pattern havng half its period. It should be remembered that in the system described the mask and wafer must be scanned past the annular area of good correction as described, e.g., in U.S. Pat. No. 4,011,011 in order to fully expose the optical disk.

In another embodiment the optical system is purely refractive, e.g., as in step and repeat projection mask aligner. Here again, obscuration means are used to block all light diffracted by the mask pattern except the first order.

In both cases careful selection of parameters are necessary for optimum performance, e.g., illumination, spatial and spectral coherence, object mask pattern and optical imaging system stop should be carefully selected in a coordinated manner. Unequal lines and spaces may be made by the appropriate exposure selection.

DESCRIPTION

Figure 1:
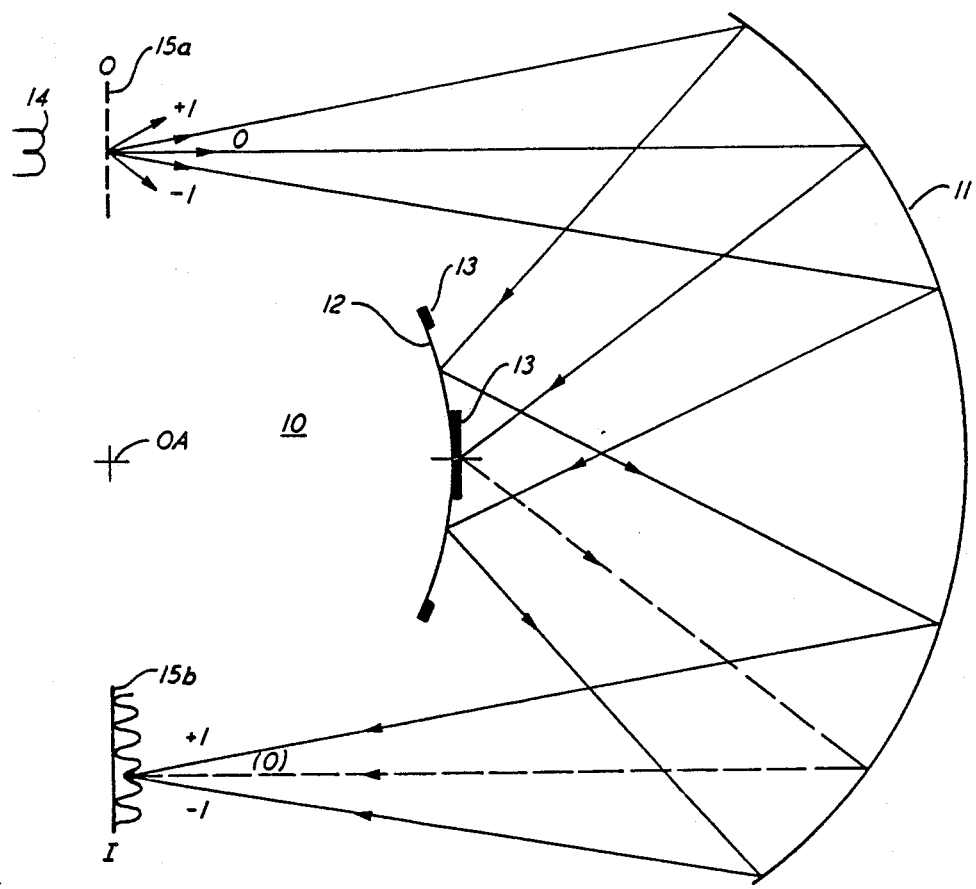
FIG. 1 illustrates in schematic form a first embodiment of the present invention utilizing an off axis optical system.

Referring to FIG. 1 there is shown an off axis afocal optical system 10 comprising concave mirror 11 and convex mirror 12. Concave mirror 11 and convex mirror 12 are arranged so that their centers of curvature are nearly coincident on the optical axis of the system. The mirror surfaces of concave mirror 11 and convex mirror 12 face each other. The radius of curvature of convex mirror 12 is smaller than that of concave mirror 10 so that rays of light from object point 0 are reflected from concave mirror 11 to convex mirror 12 and thence to concave mirror 11 and therefrom to image point I. This arrangement produces a well corrected image of the object within an annular ring concentric to the optical axis which is highly useful in the microlithography art as described in the above mentioned patents. The term "nearly coincident" is used inasmuch as it has been shown that if the centers of curvature are permitted to deviate a little from coincidence, the width of the ring of well corrected imagery is increased and is still within acceptable microlithography standards.

By placing obscurations 13 as shown at or on the convex mirror 12 an image of a mask 15a patterned with concentric or spiral circles having a period A placed at the object point and properly illuminated by a source 14 will project an image of the pattern to the image point I having a period ½ A. An optical disk 15b placed at the image point thus would be exposed to a pattern with lines and spaces half the period of those on the mask. Appropriate processing, e.,g. developing and etching will then provide an optical disk having a storage capacity four times that normally possible.

The obscurations functionn as a spatial filter and block all orders of diffracted light through the mask except the two first orders, i.e., the zero order and second and greater orders of light are blocked. This results in the phenomena of halving the period of the lines and spaces projected onto a target disposed at the image plane I. Thus, on processing a photoresist coated glass disk results in an optical disk with double the number of lines and spaces possible through conventional techniques and, thus, allowing up to four times the storage capacity.

Table 1 lists the basic system parameters referred to the image. The desired diffracted orders are transmitted through the unobstructed pupil between $N_1$ and $N_2$.

TABLE 1
System Variables

Wavelength of light : $\lambda$
Image system numerical aperture : $N_O$
Source numerical aperture : $N_s = \sigma_s N_O$
Central pupil stop numerical aperture : $N_1 = \sigma_1 N_O$
Outer pupil stop numerical aperture : $N_2 = \sigma_2 N_O$
The source coherence is $\sigma_s$; $\sigma_1$ and $\sigma_2$ are constants of proportion where $0 < \sigma_s < \sigma_1$ and $0 < \sigma_s < (\sigma_2 - \sigma_1)$
The mask period is $\lambda_m$
The image period is $\lambda_i = \frac{1}{2}\lambda_m$ Table 2 gives the basic relationships for this imaging technique. The relationships must hold for all variables i.e., over all image period ranges and wavelengths used.

TABLE 2
System Relations $$0 < N_s < N_1 \left( \frac{\lambda}{\lambda_m} - N_s \right)$$

$$\left( \frac{\lambda}{\lambda_m} + N_s \right) < N_2 < \left( 2\frac{\lambda}{\lambda_m} - N_s \right) < N_0$$

Figure 2:
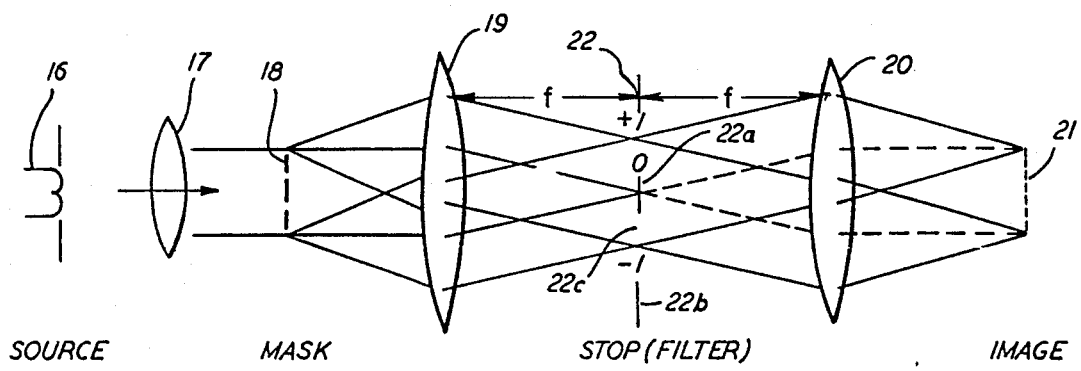
FIG. 2 illustrates in schematic form another embodiment of the present invention utilizing an on axis optical system.

FIG. 2 illustrates an on-axis refractive optical system embodying the concept of the reflective off-axis optical system of FIG. 1.

The optical system of FIG. 2 comprises a spectrally filtered light source 16 of controlled area (or a laser), collimating lens 17, a mask 18 disposed at the object plane of the system, imaging lenses 19 and 20, and an optical disk 21 disposed at the image plane of the system. The optical disk 21 is coated with a light sensitive material. A spatial filter 22 is disposed between lenses 19 and 20 at the (pupil) focal plane of lens 19. The spatial filter 22 is essentially a stop having an opaque center portion 22a and an opaque outer annular portion 22b which together form an annular opening 22c.

The mask 18 is patterned the same as mask 15a of the system of FIG. 1, i.e., with concentric or spiral rings having period $\lambda_m$. The pattern may be composed of transparent spaces and opaque lines or of alternating phase differences in an all transparent phase mask or a combination.

Upon illumination of the mask 18 its pattern is imaged at the image plane onto optical disk 21. As in the case of the system of FIG. 1 the imaged pattern has a period which is one half that of the mask pattern. Thus, after appropriate processing, e.g., developing and etching the memory capacity of the optical disk 21 is up to four times that ordinarily expected from the mask 18.

Other modifications of the invention are possible in light of the above description which should not be interpreted as placing limitations on the invention beyond those set forth in the claims which follow:

I claim:

1. In an afocal optical system for projecting a well corrected ring field, off-axis image of an object;
   at least one concave and convex mirror having their centers of curvature nearly coincident on a common optical axis;
   a mask having a pattern formed therein disposed at a first conjugate point of the system;
   an illumination source disposed relative to said mask and mirrors for imaging said pattern at a second conjugate point of the system;
   means disposed at said convex mirror for blocking zero order light and the second and above orders of light caused by diffraction of light by said mask pattern from said illumination source.

2. A system according to claim 1 wherein said mask pattern comprises a plurality of concentric circular rings.

3. A system according to claim 2 wherein said circular rings are formed by transparent and opaque areas.

4. A system according to claim 1 wherein said circular rings are formed by alternating phase differences in thickness of an all transparent mask.

5. A system according to claim 2 wherein said circular rings of said mask have a period equal to two times the period of those of the image formed at the second conjugate point.

6. An optical system comprising:
   a mask having a repetitive pattern formed thereon;
   optical means for imaging said pattern at an image plane;
   illumination means for projecting said pattern through said optical means imaging said pattern at an image plane;
   means disposed within said optical means for blocking all orders of light caused by diffraction of light by the pattern on said mask except the first orders whereby the image formed at said image plane has a period half that of said mask pattern.

7. An optical system according to claim 6 wherein:
   said repetitive pattern comprises a plurality of concentric rings.

8. An optical system according to claim 7 wherein said concentric rings are formed by alternating transparent and opaque areas.

9. An optical system according to claim 7 wherein said concentric rings are formed by alternating phase differences in thickness of an all transparent mask.

* * * * *